(12) United States Patent
Iwagami et al.

(10) Patent No.: US 6,717,828 B2
(45) Date of Patent: Apr. 6, 2004

(54) POWER SEMICONDUCTOR DEVICE

(75) Inventors: Toru Iwagami, Tokyo (JP); Shinya Shirakawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/274,891

(22) Filed: Oct. 22, 2002

(65) Prior Publication Data
US 2003/0193819 A1 Oct. 16, 2003

(30) Foreign Application Priority Data
Apr. 16, 2002 (JP) ........................................ 2002-113397

(51) Int. Cl.[7] .............................................. H02H 7/122
(52) U.S. Cl. ................................................... 363/56.03
(58) Field of Search ............................... 363/17, 56.02, 363/56.03, 56.04, 132

(56) References Cited
U.S. PATENT DOCUMENTS 5,675,169 A * 10/1997 Hoshi et al. ................. 257/355
5,751,120 A * 5/1998 Zeitler et al. ................ 315/307
5,761,055 A * 6/1998 Okada et al. ............. 363/56.08
6,639,811 B2 * 10/2003 Hosotani et al. .............. 363/19

* cited by examiner

*Primary Examiner*—Adolf Berhane
(74) *Attorney, Agent, or Firm*—Oblon, Spivak, McClelland, Maier & Neustadt, P.C.

(57) ABSTRACT

A power semiconductor device includes a half bridge circuit, a control circuit and a noise removal circuit. The half bridge circuit includes a switching element on a low voltage side and a switching element on a high voltage side, those switching elements serially connected. The control circuit controls a switching operation of the switching element on a low voltage side in the half bridge circuit. The control circuit has a supply-voltage receiving terminal connected to a high voltage side of a power supply for driving the control circuit. The noise removal circuit including, for example, a zener diode, is interposed between the supply-voltage receiving terminal of the control circuit and the low voltage side terminal of the switching element on a low voltage side, to remove noise generated on a conductor connected to a low voltage side terminal of the switching element on a low voltage side.

5 Claims, 2 Drawing Sheets

POWER SEMICONDUCTOR DEVICE

BACKGROUND OF THE INVENTION

1. Field of the Invention

The present invention relates to a power semiconductor device for performing power conversion and, more particularly, to protection to serge in the power semiconductor device.

2. Related Art

A general power semiconductor device which performs power conversion includes an inverter circuit having a parallel connected plurality of half bridge circuits each including serially connected two power semiconductor elements, and a control circuit which drives the power semiconductor elements in the inverter circuit.

A protection function to an overcurrent is generally arranged for a power semiconductor device. In order to detect amount of a current flowing through the power semiconductor element for overcurrent protection, for example, a method of using a voltage generated in a shunt resistor connected to an inverter circuit is known. FIG. 3 shows a configuration of a conventional power semiconductor device for detecting an overcurrent by using such a method.

As shown in FIG. 3, the power semiconductor device has power semiconductor elements SW1 and SW2 which are on a low voltage side and a high voltage side, respectively, control circuits IC1 and IC2 for driving and controlling the respective power semiconductor elements SW1 and SW2, and free-wheeling diodes FW1 and FW2 of the power semiconductor elements SW1 and SW2. The power semiconductor device outputs an output voltage obtained by controlling the switching operations of the power semiconductor elements SW1 and SW2, from an output terminal VS.

In the power semiconductor device, a shunt resistor R1 is connected between an emitter terminal N1 of the power semiconductor element SW1 on the low voltage side and a reference potential terminal N connected to the low potential side of a DC power supply (to be referred to as a "control power supply" hereinafter) for driving the control circuits IC1 and IC2. A voltage VR1 proportional to amount of a current flowing in the power semiconductor element SW1 is generated across the shunt resistor R1. As shown in FIG. 3, a parasitic inductance L exists between the emitter terminal N1 of the power semiconductor element SW1 and the shunt resistor R1.

The control circuit IC1 has a terminal VIN to which a control power supply voltage is input, a current detection terminal CIN, and an output terminal OUT1 for outputting a control signal for controlling the power semiconductor element SW1. The control circuit IC1 has an overcurrent protection function, detects a current flowing in the semiconductor element SW1 with a voltage applied to the current detection terminal CIN, and outputs a control signal for turning off the semiconductor element SW1 when an overcurrent flowing in the semiconductor element SW1 is detected. More specifically, the voltage VR1 generated across the shunt resistor R1 is applied to the current detection terminal CIN of the control circuit IC1 through a filter circuit including a resistor R2 and a capacitor C1. When the voltage of the current detection terminal CIN exceeds a reference level, the overcurrent protection function of the control circuit IC1 serves becomes active to cut off the output OUT1 thereof.

When the overcurrent protection function described above operates, a surge voltage with a relatively high level may occur between the terminals N1 and N due to the parasitic inductance L of a conductor or wire extending from the emitter terminal N1 to the resistor R1. A control power supply voltage VD is applied between the reference potential terminal N of the control power supply voltage and a power supply terminal VCC through a smoothing capacitor C2. Therefore, a high voltage obtained by superposing the control power supply voltage VD to the surge voltage applied between the terminals N1 and N is applied between the terminals N1 and VCC. Hence, a very high surge voltage may be applied between the terminals N1 and N, and thus can break the control circuit IC1.

SUMMARY OF THE INVENTION

The present invention has been made to solve the above problems, and has an object to provide a power semiconductor device capable of preventing a control circuit which controls a switching operation of semiconductor elements from being broken by a surge voltage applied between predetermined terminals of the control circuit.

In the first aspect of the invention, provided is a power semiconductor device comprising a half bridge circuit, a control circuit, and a noise removal circuit. The half bridge circuit includes a switching element on a low voltage side and a switching element on a high voltage side. Those switching elements are serially connected. The control circuit is operable to control a switching operation of the switching element on a low voltage side in the half bridge circuit. The control circuit has a supply-voltage receiving terminal connected to a high voltage side of a power supply for driving the control circuit. The noise removal circuit is operable to remove noise generated on a conductor connected to a low voltage side terminal of the switching element on a low voltage side. The noise removal circuit is interposed between the supply-voltage receiving terminal of the control circuit and the low voltage side terminal of the switching element on a low voltage side. In the power semiconductor device, the noise removal circuit may includes a zener diode or a capacitor.

According to the semiconductor device in the first aspect, even though a surge voltage is generated between the power supply receiving terminal of the control circuit and the low voltage terminal of the switching element on the low voltage side, the noise reduction means can suppress a sharp variation in voltage to protect the control circuit from a break.

In the second aspect of the invention, provided is a power semiconductor device including a half bridge circuit, a control circuit, and a noise removal circuit. The half bridge circuit includes a switching element on a low voltage side and a switching element on a high voltage side. Those switching elements are serially connected. The control circuit is operable to control a switching operation of the switching element on a low voltage side in the half bridge circuit. The control circuit has a reference potential terminal connected to a reference potential terminal of a power supply for driving the control circuit. The reference potential terminal provides a reference potential. The noise removal circuit is operable to remove noise generated on a conductor connected to a low voltage side terminal of the switching element on a low voltage side. The noise removal circuit is interposed between the reference potential terminal of the control circuit and the low voltage side terminal of the switching element on a low voltage side. In a power semiconductor device, the noise removal circuit may include a capacitor.

According to the semiconductor device in the second aspect, a sharp variation in voltage generated between the reference potential terminal of the control circuit for controlling the switching element on the low voltage side and the low voltage terminal of the switching element on the low voltage side can be suppressed. Accordingly, a control circuit can be prevented from being broken by surge.

DETAILED DESCRIPTION OF PREFERRED EMBODIMENTS

Embodiments of a power semiconductor device according to the present invention will be described below with reference to the accompanying drawings.

First Embodiment

Figure 1:
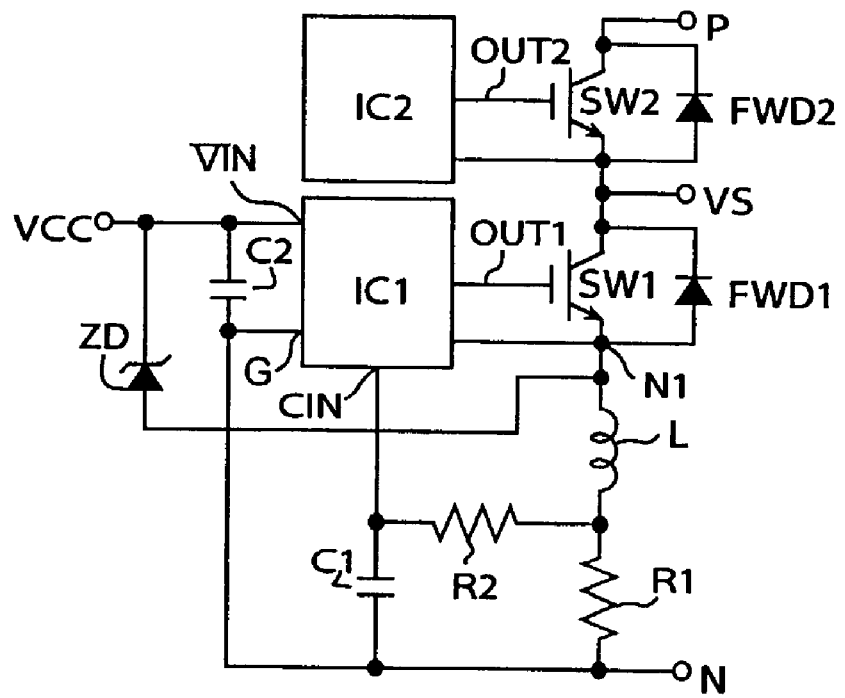
FIG. 1 is a diagram of a power semiconductor device according to the present invention (First Embodiment).

FIG. 1 shows a configuration of a power semiconductor device according to the present invention. The power semiconductor device includes serially connected power semiconductor elements SW1 and SW2 which are respectively disposed on a low voltage side and a high voltage side, control circuits IC1 and IC2 for driving and controlling the respective power semiconductor elements SW1 and SW2, and free-wheeling diodes FW1 and FW2 of the respective power semiconductor elements SW1 and SW2. The power semiconductor device has a power supply receiving terminal VCC connected to a high potential side of a control power supply for driving the control circuits IC1 and IC2, a reference potential terminal N connected to a reference potential of the control power supply, and an output power supply terminal P connected to the high potential side of a power supply (to be referred to as a "driving power supply" hereinafter) for driving a switching element connected to the output of the power semiconductor device. A shunt resistor R1 is connected between an emitter terminal N1 of the power semiconductor element SW1 on the low voltage side and the terminal N connected to the low potential side of the control power supply. A parasitic inductance L exists on a conductor or wire between the emitter terminal which is a low potential terminal of the power semiconductor element SW1 and the shunt resistor R1. A filter circuit including a resistor R2 and a capacitor C1 is connected to the shunt resistor R1.

The control circuits IC1 and IC2 controls a base-emitter voltage of the power semiconductor elements SW1 and SW2 serving as switching elements to control the switching operations thereof. An output terminal VS is switched to the terminal P or the terminal N1 depending on the switching operations of the power semiconductor elements SW1 and SW2. The control circuit IC1 has a terminal VIN to receive a power supply voltage Vcc for driving the control circuit IC1, a current detection terminal CIN, an output terminal OUT1 to output a control signal for controlling the operation of the power semiconductor element SW1, and a reference potential terminal G connected to the terminal N. The current detection terminal CIN is connected to a junction of the resistor R2 and the capacitor C1 of the filter circuit. A power supply voltage Vcc is applied to the power supply receiving terminal VIN of the control circuit IC1 through a smoothing capacitor C2.

The control circuit IC1 has an overcurrent protection function. The circuit IC1 inputs a voltage VR1 generated across the shunt resistor R1 at the current detection terminal CIN of the control circuit IC1 through the filter circuit including the resistor R2 and the capacitor C1, and decides whether the voltage of the current detection terminal CIN exceeds a reference level. When the voltage exceeds the reference level, the control circuit IC1 determines that an overcurrent flows in the control circuit IC1 to cut off the output OUT1 and turn off the semiconductor element SW1.

In particular, in the power semiconductor device according to the present embodiment, a zener diode ZD is interposed as a noise removal circuit between the power supply receiving terminal VIN of the control circuit IC1 and the emitter terminal N1 of the low voltage semiconductor element SW1. The zener diode ZD connected to the emitter terminal N1 of the low voltage power semiconductor element SW1 can remove noise generated by the parasitic inductance L on the conductor between the emitter terminal N1 and the shunt resistor R1. More specifically, even though a high surge voltage is applied between the terminals N1 and VIN (VCC) due to the parasitic inductance L, a voltage between the terminals N1 and VIN (VCC) can be suppressed to a breakdown voltage of the zener diode ZD or less, and thus the control circuit IC1 can be prevented from being broken. It is noted that the zener diode ZD may be incorporated in the control circuit IC1.

Second Embodiment

Figure 2:
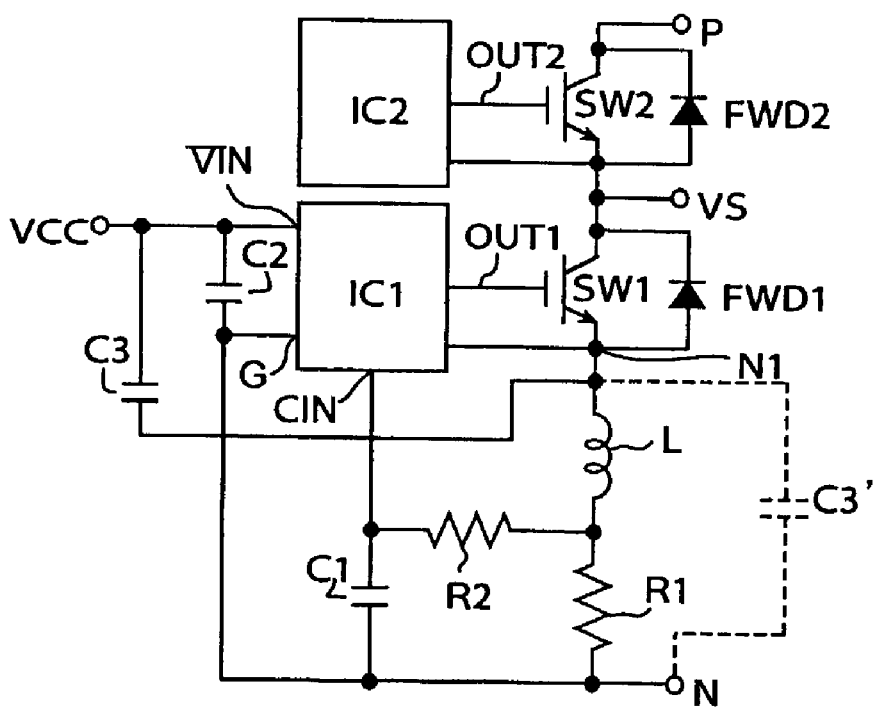
FIG. 2 is a diagram of a power semiconductor device according to the present invention (Second Embodiment).
Figure 3:
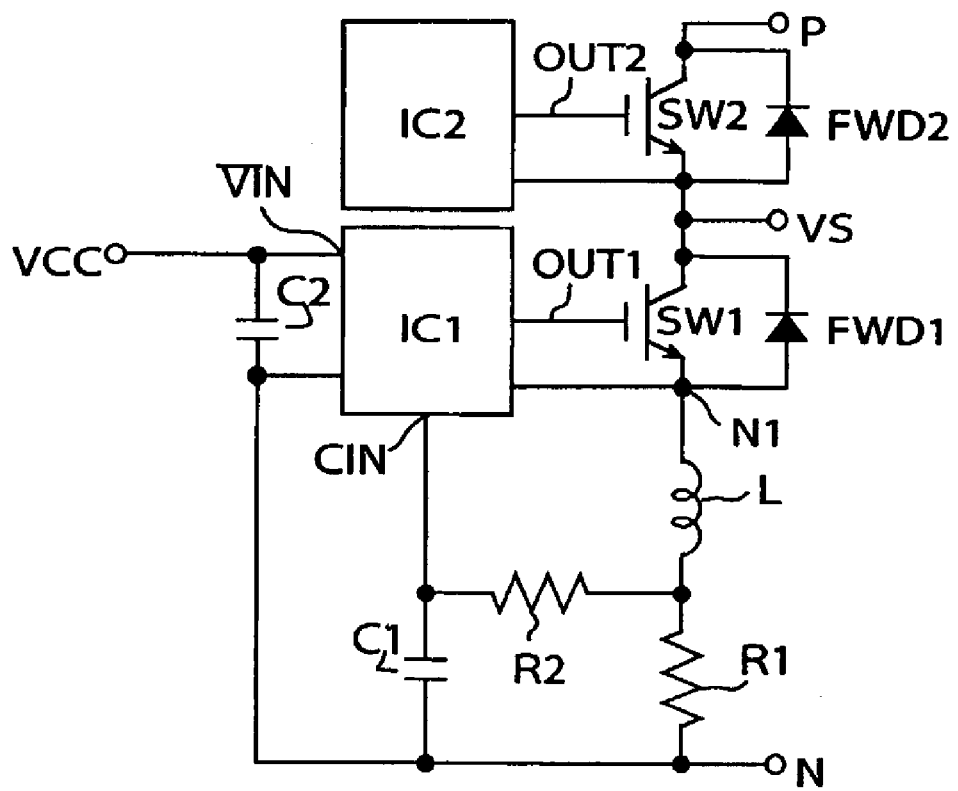
FIG. 3 is a diagram of a conventional power semiconductor device.

FIG. 2 shows a configuration of the second embodiment of a power semiconductor device according to the present invention. The power semiconductor device according to the present embodiment employs a capacitor C3 as the noise removal circuit, in place of the zener diode ZD arranged in the power semiconductor device according to the first embodiment. The capacitor C3 can prevent a sharp variation in voltage applied between the terminals N1 and VIN (VCC), and protect the control circuit IC1 from a break by a surge voltage.

As shown by a broken line in FIG. 2, a capacitor C3' in place of the capacitor C3 can be connected between terminals N1 and N. This also can prevent a sharp variation in voltage applied between the terminals N1 and VIN (VCC), and thus protect the control circuit IC1 from a break by a surge voltage.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application No. 2002-113397, filed on Apr. 16, 2002, which is expressly incorporated herein by reference in its entirety.

What is claimed is:

1. A power semiconductor device comprising:
    a half bridge circuit including a switching element on a low voltage side and a switching element on a high voltage side, those switching elements serially connected;
    a control circuit operable to control a switching operation of the switching element on a low voltage side in the half bridge circuit, the control circuit having a supply-voltage receiving terminal connected to a high voltage side of a power supply for driving the control circuit; and
    a noise removal circuit operable to remove noise generated on a conductor connected to a low voltage side terminal of the switching element on a low voltage side, the noise removal circuit interposed between the supply-voltage receiving terminal of the control circuit and the low voltage side terminal of the switching element on a low voltage side.

2. The power semiconductor device according to claim 1, wherein the noise removal circuit comprises a zener diode.

3. The power semiconductor device according to claim 1, wherein the noise removal circuit comprises a capacitor.

4. A power semiconductor device comprising:

a half bridge circuit including a switching element on a low voltage side and a switching element on a high voltage side, those switching elements serially connected;

a control circuit operable to control a switching operation of the switching element on a low voltage side in the half bridge circuit, the control circuit having a reference potential terminal connected to a reference potential terminal of a power supply for driving the control circuit, the reference potential terminal providing a reference potential; and a noise removal circuit operable to remove noise generated on a conductor connected to a low voltage side terminal of the switching element on a low voltage side, the noise removal circuit interposed between the reference potential terminal of the control circuit and the low voltage side terminal of the switching element on a low voltage side.

5. The power semiconductor device according to claim 4, wherein the noise removal circuit comprises a capacitor.

* * * * *